United States Patent
Yamana

(10) Patent No.: US 6,566,036 B2
(45) Date of Patent: May 20, 2003

(54) CHEMICALLY AMPLIFIED RESIST

(75) Inventor: Mitsuharu Yamana, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/745,469

(22) Filed: Dec. 26, 2000

(65) Prior Publication Data

US 2001/0009749 A1 Jul. 26, 2001

(30) Foreign Application Priority Data

Dec. 28, 1999 (JP) .......................................... 11-372657

(51) Int. Cl.[7] .............................. G03C 1/73; G03C 1/74; G03F 7/039; G03F 7/20; G03F 7/30
(52) U.S. Cl. ................... 430/270.1; 430/326; 430/905; 430/909; 430/914; 430/920; 430/921
(58) Field of Search ............................. 430/270.1, 326, 430/914, 920, 921, 909, 905

(56) References Cited

U.S. PATENT DOCUMENTS 5,679,485 A * 10/1997 Suzuki et al. ................. 430/18

FOREIGN PATENT DOCUMENTS

| EP | 0 789 279 A1 | * 8/1997 |
| EP | 0 803 775 A1 | * 10/1997 |

* cited by examiner

*Primary Examiner*—Janet Baxter
*Assistant Examiner*—Sin J. Lee
(74) *Attorney, Agent, or Firm*—Foley & Lardner

(57) ABSTRACT

A chemically amplified resist including base resin represented by a general formula [1], a radiation-sensitive acid generator; polystyrene acting as a filler and a solvent dissolving the resin, the acid generator and the filler; wherein a content of the resin is between 10 and 20% in weight with respect to the entire chemically amplified resist, contents of the acid generator and the filler are between 1 and 15% in weight and between 0.5 and 6.0% in weight, respectively, with respect to the resin, and a balance is the solvent. The chemically amplified resist having the excellent controllability with respect to dimensions and shapes can be obtained because a free volume of the chemically amplified resist is reduced by filling a free volume in the chemically amplified resist with the filler:

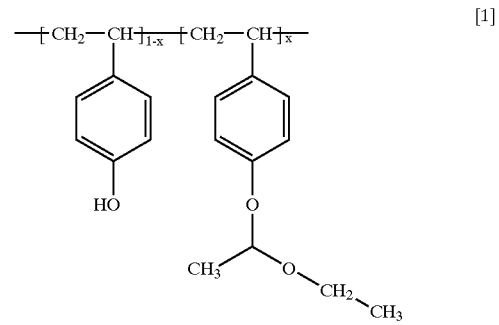

12 Claims, 5 Drawing Sheets

CHEMICALLY AMPLIFIED RESIST

BACKGROUND OF THE INVENTION (a) Field of the Invention

The present invention relates to a chemically amplified resist, more in particular to the chemically amplified resist having excellent controllability with respect to dimensions and shapes and being responsive to the design rule of 0.15 μm or less.

(b) Description of the Related Art

A higher integration and a finer design rule have been achieved in the field of LSI together with development miniaturization and higher performance of the semiconductor devices. This accelerates development of photolithographic technology for stably conducting the miniaturization processing of the semiconductor device having a line width of 0.18 μm or less with a higher accuracy.

In the conventional exposure method using visible rays having a wavelength between 400 and 700 nm or near ultraviolet rays having a wavelength between 300 and 400 nm, fine processing for a pattern having a line width of 0.18 μm or less can be hardly conducted. A method for using, as exposure light, far ultraviolet rays such as KrF excimer laser rays having a wavelength of 248 nm is researched as the photolithographic technology which may meet the design rule applied to the finer pattern and has a wider range of a focal depth. A chemically amplified resist is proposed as higher resolution resist applicable to such the short wavelength rays (radiation), and is researched for commercialization.

The chemically amplified resist contains, as a component, a radiation-sensitive acid generator which generates an acid upon exposure to light in addition to resin which is the main component thereof. Chemical reactions such as change of polarities and cleavage of a chemical bond progress in the resin of the resist film due to the catalysis of the acid, and the solubility into the developer in the exposing section is changed.

The chemically amplified resist forms patterns by utilizing the change of the solubility into the developer in the exposing section due to the elimination of a protection group by the acid catalysis.

A chemically amplified resist conventionally used contains hydroxystyrene resin represented by the general formula [1] and a radiation-sensitive acid generator dissolved in a solvent in a weight ratio of 16.0:0.80:83.20 in this turn, and 40% of hydroxyl groups of the hydroxystyrene resin are protected by ethoxyethyl groups.

For patterning an interconnect layer by using the conventional resist by means of the pattern transfer, exposure is conducted by using a stepper in which the KrF excimer laser rays having the wavelength of 248 nm is used as exposure light.

However, in the conventional resist, the unsatisfactorily controllability with respect to the dimensions and the shape does not reach to the level of commercialization which responds to the 0.15 μm design rule.

The present inventor has confirmed this fact by the following experiment. An organic thin-film having a thickness of 0.10 μm was deposited, as a reflection preventing film, on an interconnect layer made of polycrystalline silicon. The conventional chemically amplifying resist was applied thereon to form a resist layer having a thickness of 0.50 μm. The exposure was conducted through a mask pattern by using the stepper employing the KrF excimer laser rays as the exposure light under the conditions that the number of apertures (NA) was 0.60 and a coherent factor (σ) was 0.75, thereby forming a pattern of isolated lines having a thickness of 0.15 μm after the development.

The thus obtained resist pattern 11 as shown in FIG. 1 included an undesired rounded top shape, and the interface 12 between the resist layer and the reflection preventing layer 13 was not linear but intensely zigzagged as shown in FIG. 1. When the polycrystalline silicon layer 14 was etched by using the above pattern as the mask, the roughness of the side wall 15 of the polycrystalline silicon layer 14 was increased.

After the lapse of 3 hours' standing upon the exposure, the pattern was developed. The pattern dimensions were not settled in the critical dimensions (CD) which were 0.15 μm±10%.

The rounded top provided the poor durability to the etching, and the unsatisfactory controllability with respect to the pattern dimensions and shapes.

The photolithography satisfying the 0.15 μm rule cannot be conducted which is a standard rule for fabricating a future semiconductor device.

SUMMARY OF THE INVENTION

In view of the foregoing, an object of the present invention is to provide a chemically amplified resist having the excellent controllability with respect to dimensions and shapes and being responsive to the 0.15 μm design rule.

Thus, the present invention provides a chemically amplified resist including hydroxystyrene resin protected by an ethoxyethyl group and acting as base resin, the hydroxystyrene resin having a molecular weight between 5000 and 20000 and represented by a general formula [1]; a radiation-sensitive acid generator; polystyrene acting as a filler and having a molecular weight between 150 and 20000; and a solvent for dissolving the base resin, the acid generator and the filler, wherein a content of the hydroxystyrene resin is between 10 and 20% in weight with respect to the entire chemically amplified resist, contents of the acid generator and the filler are between 1 and 15% in weight and between 0.5 and 6.0% in weight, respectively, with respect to the base resin, and a balance is the solvent.

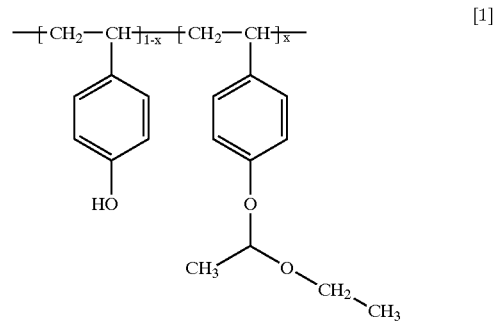

[1]

In accordance with the present invention, the chemically amplified resist having the excellent controllability with respect to dimensions and shapes can be obtained because a free volume of the chemically amplified resist is reduced by filling a free volume in the chemically amplified resist with the filler.

The above and other objects, features and advantages of the present invention will be more apparent from the following description.

PREFERRED EMBODIMENTS OF THE INVENTION

Now, the present invention is more specifically described with reference to accompanying drawings.

The present inventor has found the following during the elucidation of the above-described problems of the chemically amplified resist.

Figure 1:
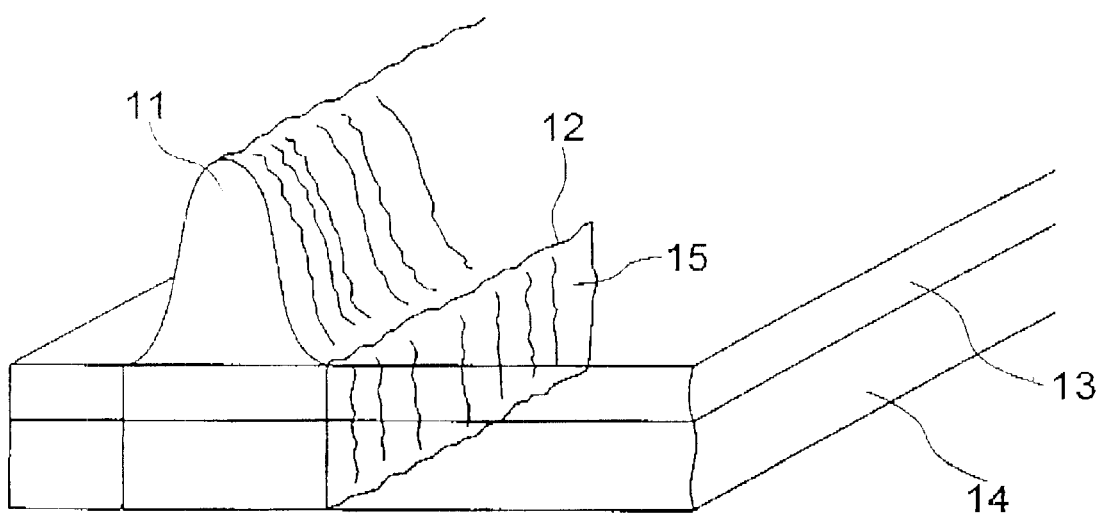
FIG. 1 is a schematic view showing a problem in forming patterns in a conventional chemically amplified resist.
Figure 2A:
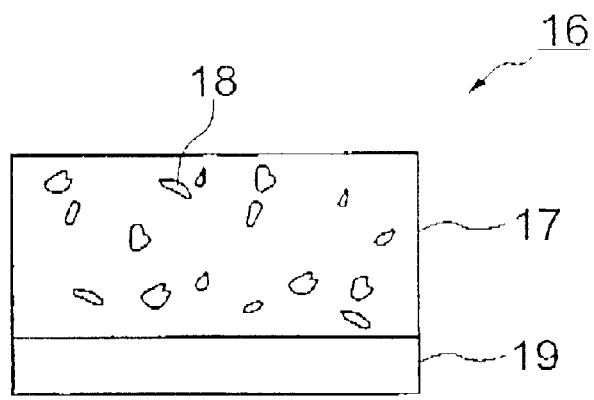
FIGS. 2A to 2D are schematic sectional views sequentially showing the production of the conventional chemically amplified resist.
Figure 2B:
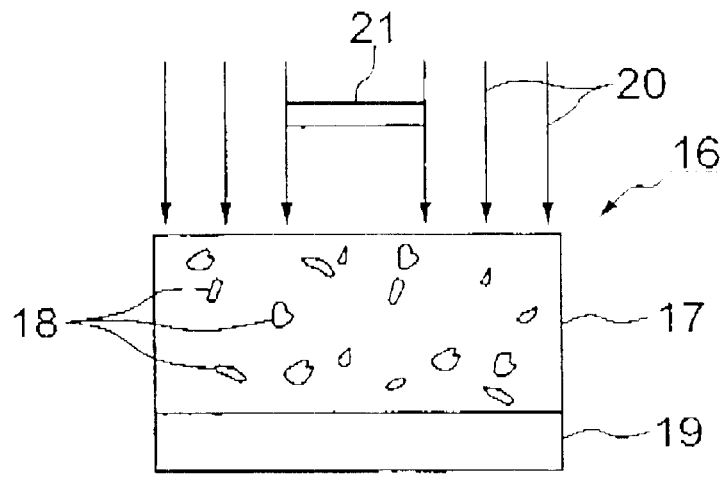
Figure 2C:
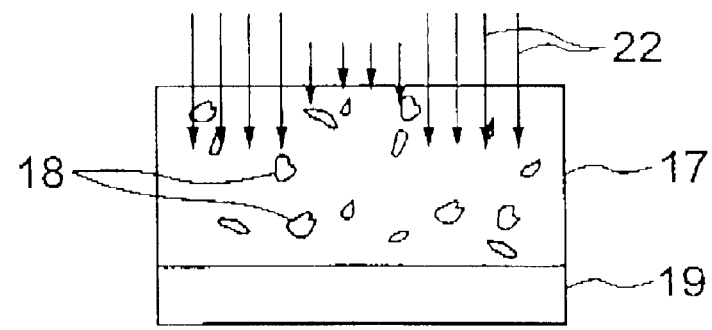
Figure 2D:
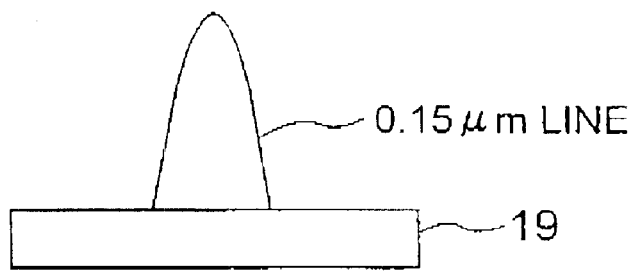

A conventional chemically amplified resist 16 includes a resist layer 17 having a free volume 18 therein on a silicon substrate 19 as shown in FIG. 2A. The resist Layer 17 is coarse or porous and the particles thereof are not in the closest packing, thereby increasing the free volume of the resist layer 17. When the resist layer 17 is exposed by krF excimer laser light 20 with use of a mask 21 as shown in FIG. 2B, a developer 22 is likely to penetrate the resist layer 17 as shown in FIG. 2C. However, the developer 22 does not uniformly penerate the resist layer so that the resin in contact with developer 22 dissolves therein, and the resin not in contact with the developer 22 remains with out dissolving. Accordingly, as shown in FIG. 2D, the pattern shape especially the pattern shape of the top portion, is collapsed and rounded, and the interface is remarkably zigzagged. As a result, the roughness of the side wall of the etched layer is increased when the layer is etched by using the pattern.

The present inventor has also found the following after the further research.

A first reason of increasing the free volume of the resist layer of the exposed section in the conventional chemically amplified resist is a lower temperature of thermal treatment (pre-baking). In the photolithographic step wherein the resist is applied, and the thermal treatment is conducted followed by the exposure and the development, the thermal treatment at the temperature of about 100° C. lower than the glass transition temperature of the resin (about 150° C.) remains the solvent in the resist layer so that the closest packing cannot be accomplished. The remaining solvent further facilitates the penetration of the developer near the solvent in the resist layer during the development, and accordingly, the developer corrodes the resin to collapse the shape of the resist layer.

A second reason thereof is use of ethoxyethyl group-protected hydroxystyrene resin having a long chain branched from the main chain. The long branched chain is easily eroded to be dissolved.

With respect to the first reason, the thermal treatment at a temperature higher than the glass transition temperature (about 150° C.) allows the most of the solvent in the chemically amplified resist to evaporate, but thermally decomposes the ethoxyethyl group to lower the solvent selectivity. Accordingly, the precise transfer of the mask pattern is hardly conducted. Therefore, the thermal treatment at the temperature of 100° C. or more is impracticable.

In order to reduce the free volume of the chemically amplified resist even when the pre-baking is conducted at the temperature of 100° C. or less lower than the glass transition temperature of the resin, a filler which fills the free volume in the chemically amplified resist to reduce the free volume thereof is added to the chemically amplified resist, thereby accomplishing the closest packing.

After examination of various organic compounds, it has been confirmed that addition of a specified ratio of polystyrene, that is, 10% in weight or more having a molecular weight between 150 and 20000 which is highly dissolved in a solvent can realize the resist of the closest packing. The polystyrene is the main component of the main chain.

The polystyrene including the smaller and shorter structure branched from the main chain easily penetrates the resin to fill the free volume therein. Further, the higher hydrophobicity of the polystyrene prevents the excessive development.

The hydoxystyrene resin protected by the ethoxyethyl group of the present invention has a molecular weight between 5000 and 20000. This is because the effect for suppressing the dissolution of the developer to the non-exposed portion is reduced to significantly decrease the volume of the film, thereby collapsing the pattern shape when the resin has the molecular weight below 5000, and the above effect is excessive to remain scum when the resin has the molecular weight over 20000.

The polystyrene used as the filler has a structure represented by a general formula [22].

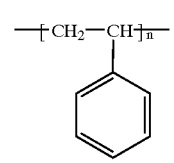

[22]

The glass transition temperature of the polystyrene is 82° C., and when the applied resist layer is pre-baked at 90° C., the polystyrene becomes more flexible to fill the free volume.

The addition rate of the filler between 0.5 and 6.0% in weight has been experimentally determined as the volume of the filler which substantially fills the free volume of the chemically amplified resist to which the filler is not added.

When the addition rate of the filler is below 0.5% in weight, the roughness of the formed resist pattern is not reduced, and further the roughness is transferred to the etched layer after the etching of the layer, thereby deteriorating the effects of the present invention. When the addition rate of the filler is over 6.0% in weight, the higher hydrophobicity of the polystyrene generates the scum to reduce the pattern strength and the controllability for the shape of the resist.

Figure 3A:
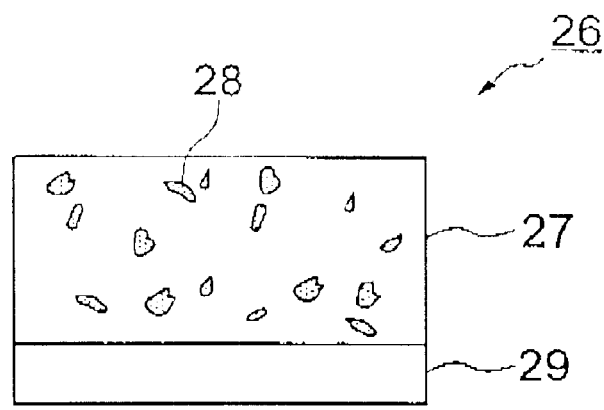
FIGS. 3A to 3D are schematic sectional views sequentially showing the production of a chemically amplified resist in accordance with an embodiment of the present invention.

As shown in FIG. 3A, a chemically amplified resist 26 in accordance with an embodiment of the present invention includes a resist layer 27 having a free volume 28 therein on a silicon substrate 29. The free volume 28 in the resist layer 27 are filled with a filler to significantly reduce the free volume of the resist layer 27. The resist layer 27 having the reduced free volume is highly hydrophobic and is not subjected to the excessive development.

Figure 3B:
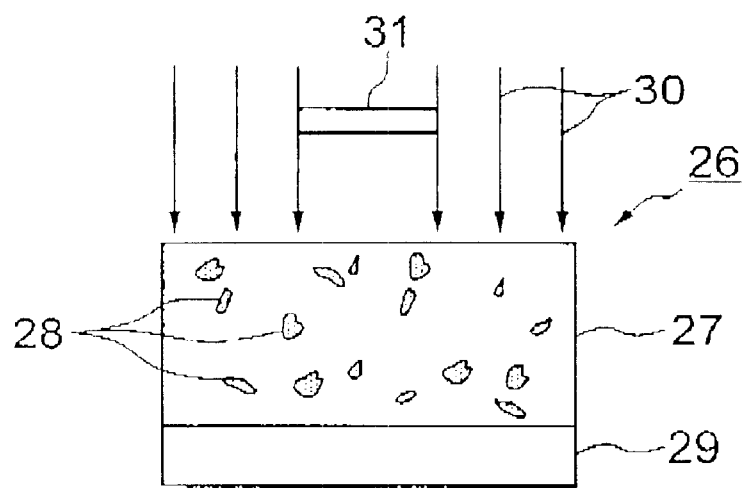
Figure 3C:
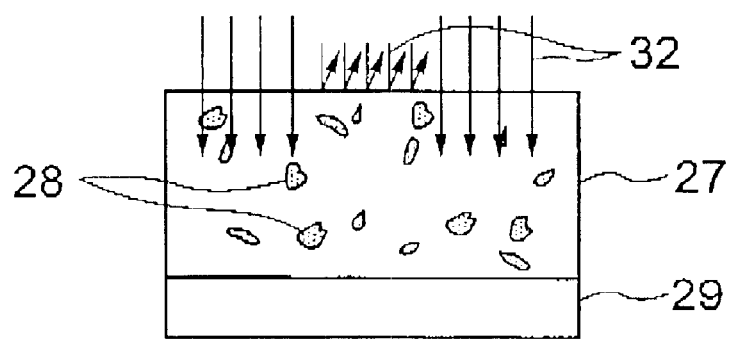
Figure 3D:
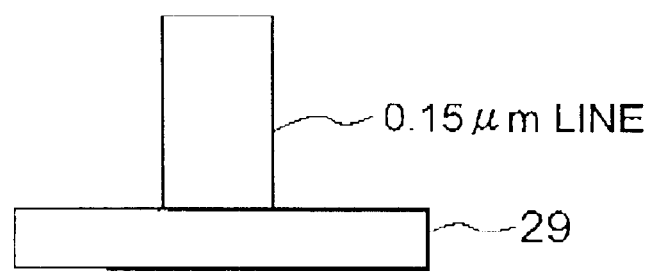

When the resist layer 27 is exposed by KrF excimer laser light 30 with use of a mask 31 as shown in FIG. 3B and developed with a developer 32 as shown in FIG. 3C, the excellent resistance against the etching does not form a rounded top. Further, as shown in FIG. 3D, the degree of the zigzag of the interface between the pattern and the underlying layer is reduced to significantly improve the controllability with respect to dimensions and shapes and to remarkably decrease the roughness of the side wall of the etched layer.

Because of the reduction of the free volume, the invasion of a basic substance in an atmosphere in contact with the chemically amplified resist thereinto and the diffusion thereof are prevented to improve the circumferential stability.

In the thermally treating step before the exposure, the chemically amplified resist of the present invention may be treated at a temperature between 90 and 110° C., thereby providing the pattern responsive to the design rule of 0.15 µm or less having the excellent shape and the accurate dimensions by precisely transferring the mask pattern.

The radiation-sensitive acid generator of the present invention includes triphenylsulfonium trifluoromethane sulfonic acid represented by the general formula [2], triphenylsulfonium methane sulfonic acid represented by the general formula [3], diphenyliodonium trifluoromethane sulfonic acid represented by the general formula [4], diphenyliodoniummethane sulfonic acid represented by the general formula [5], phthalimide trifluoromethane sulfonic acid represented by the general formula [6], phthalimide trimethane sulfonic acid represented by the general formula [7], naphthalimide trifluoromethane sulfonic acid represented by the general formula [8], naphthalimide trimethane sulfonic acid represented by the general formula [9], triphenylsulfonium toluenesulfonic acid represented by the general formula [10], triphenylsulfonium methyleyclohexylsulfonic acid represented by the general formula [11], diphenyliodonium toluenesulfonic acid represented by the general formula [12], diphenyliodonium methylcyclohexylsulfonic acid represented by the general formula [13], phthalimide toluenesulfonic acid represented by the general formula [14], phthalimide methyleyclohexylsulfonic acid represented by the general formula [15], naphthalimide toluenesulfonic acid represented by the general formula [16] and naphthalimide methylcyclohexylsulfonic acid represented by the general formula [17].

Formulas [2] through [17] are as follows:

[2]
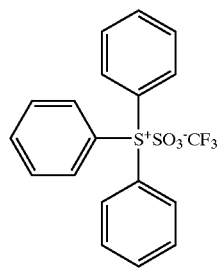

-continued

[3]
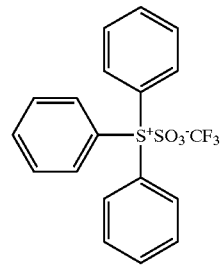

[4]
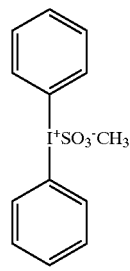

[5]
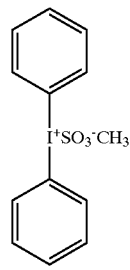

[6]
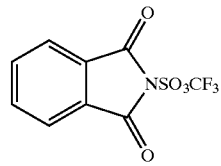

[7]
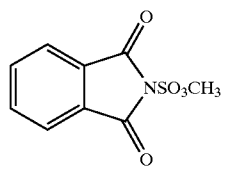

[8]
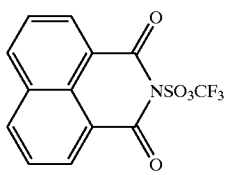

[9]
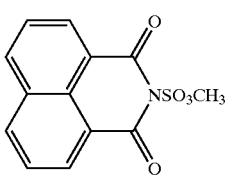

-continued

[10]
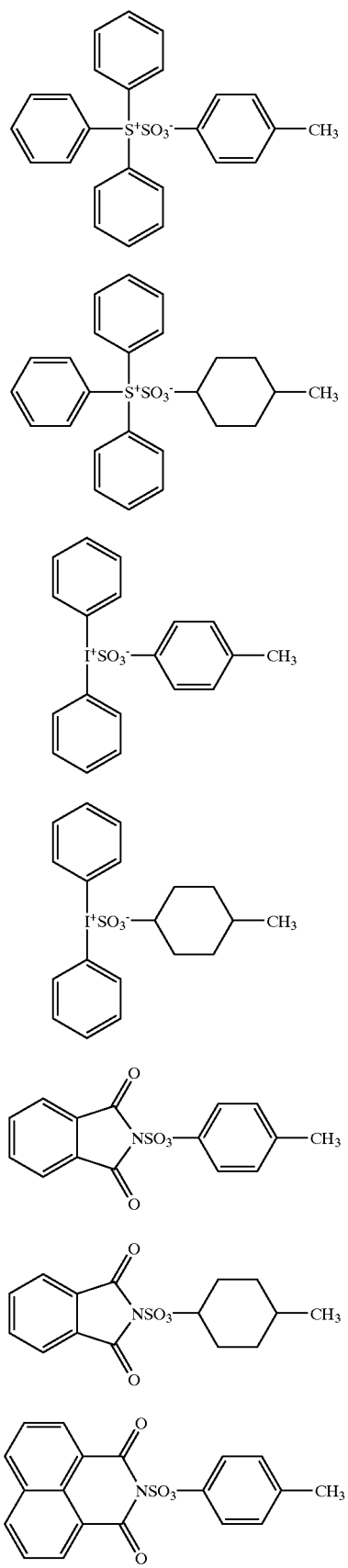

[11]

[12]

[13]

[14]

[15]

[16]

-continued

[17]
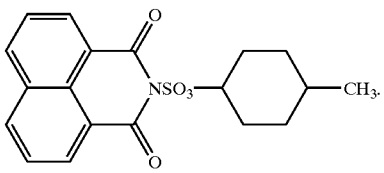

The solvent of the present invention includes 2-heptanone represented by the general formula [18], PGMEA (propylene glycol monomethylether-acetone) represented by the general formula [19], PGME (propylene glycol moonomethylether) represented by the general formula [20] and N-methylpyrrolidine represented by the general formula [21].

Formulas [18] through [21] are as follows:

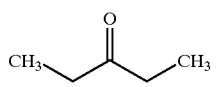
[18]

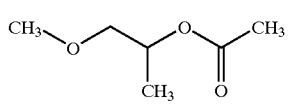
[19]

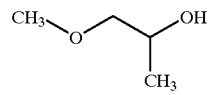
[20]

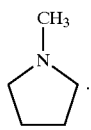
[21]

EXAMPLES

Figure 4:
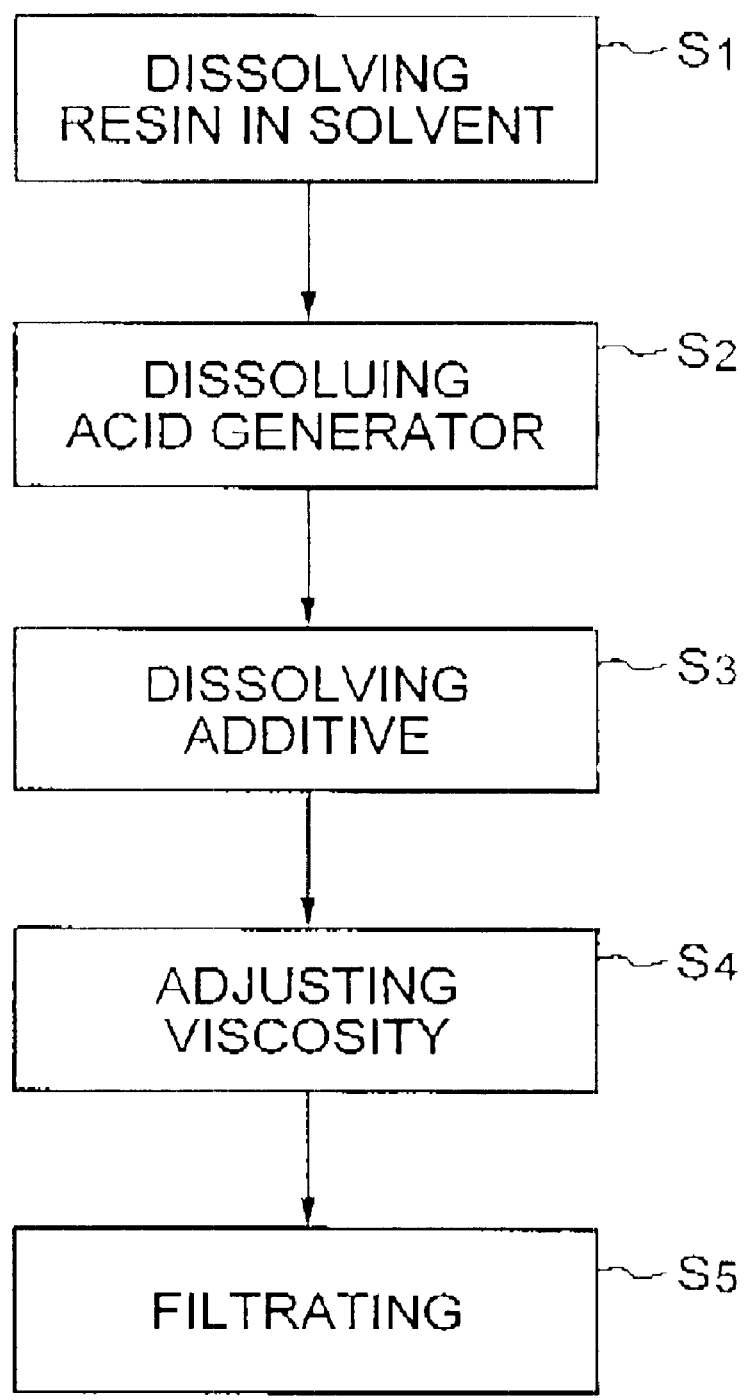
FIG. 4 is a flow chart showing a series of steps for producing a chemically amplified resist in Examples.

A chemically amplified resist of Examples was prepared in accordance with procedures shown in FIG. 4.

The chemically amplified resist included hydroxystyrene resin protected by ethoxyethyl groups represented by the general formula [1] as the main resin, triphenylsuifonium trifluoromethane sulfonic acid represented by the general formula [2] as the radiation-sensitive acid generator and the polystyrene having the molecular weight of about 10000 all dissolved in 2-heptanone represented by the general formula [18] acting as the solvent.

The content of the base resin content was 15% in weight with respect to the entire chemically amplified resist, and the contents of the acid generator and the filler were 10% in weight and 4.5% in weight, respectively, with respect to the base, and a balance was the solvent.

The chemically amplified resist was prepared in accordance with the following procedures. As shown in FIG. 4, after a specified amount of the base resin was added to a slightly larger amount of the solvent than the specified amount, the solvent was stirred for dissolving the resin to obtain a resin solution in a step $S_1$. Then, the radiation-sensitive acid generator was dissolved into the resin solution in a step $S_2$, and the filler was dissolved in a step $S_3$ to prepare the crude chemically amplified resist.

Then, after additional solvent was added thereto in a step $S_4$ to adjust the viscosity of the solution between 4.8 and 5.2 c.p., the non-soluble substance was removed by filtration to prepare the purified product, the chemically amplified resist.

The evaluation test of the chemically amplified resist thus prepared was conducted as follows.

Figure 5A:
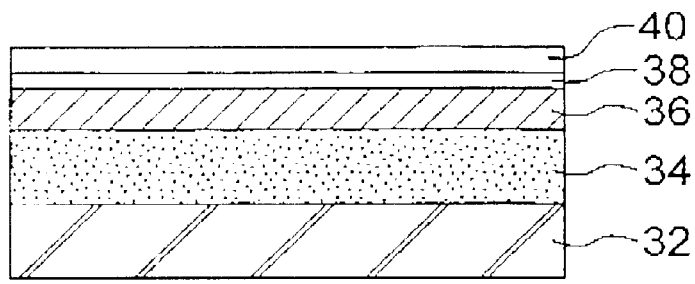
FIGS. 5A and 5B are sectional views showing a wafer including the chemically amplified resist.

At first, as shown in FIG. 5A, a $SiO_2$ film 34 having a thickness of 0.50 μm was deposited on a silicon substrate 32. After a polycrystalline silicon interconnect layer 36 having a thickness of 0.20 μm was deposited thereon by a CVD method, a reflection preventing film 38 made of an organic material having a thickness of 0.10 μm was deposited thereon. Then, a resist layer 40 having a thickness of 0.50 μm was deposited on the reflection preventing film 38 by using the above chemically amplified resist.

Figure 5B:
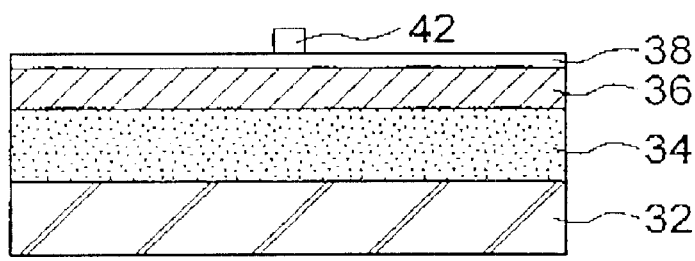

The resist layer 40 was exposed by using a stepper employing the KrF excimer light as the exposure light under the conditions that the number of apertures (NA) was 0.60 and a coherent factor (σ) was 0.75, followed by the pre-baking thermal treatment at 90° C. and the development, thereby forming a pattern 42 of isolated lines having a thickness of 0.15 μm as shown in FIG. 5B.

Figure 5C:
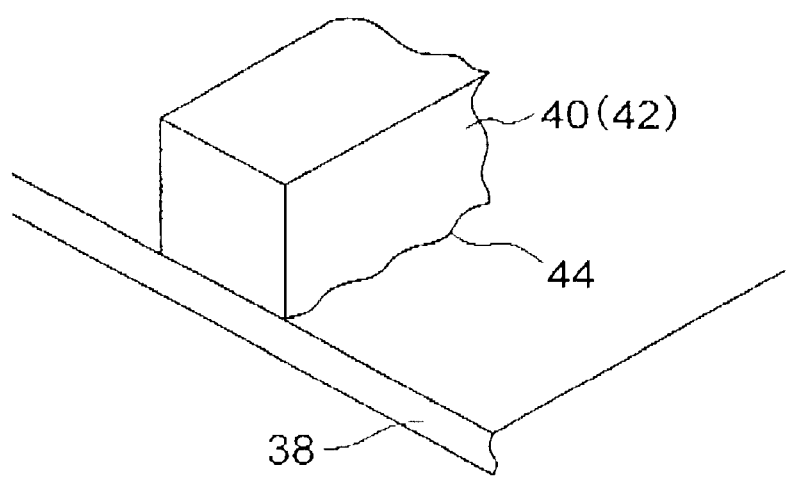
FIG. 5C is a partially broken perspective view of the wafer.

The dimensions and the shapes of the pattern 42 were inspected and measured to clarify the section of the pattern 42 to be exactly rectangular as shown in FIG. 5C. The degree of the zigzag of the interface 44 between the resist layer 40 of the pattern 42 and the reflection preventing film 38 was quite small as shown in FIG. 5C.

Further, the roughness of the side wall of the polycrystalline silicon interconnect layer 36 etched by using the pattern 42 as a mask was significantly reduced.

The pattern dimensions of the resin allowed to stand for 3 hours after the exposure had the critical dimensions (CD) in 0.15 μm±10%

A plurality of other chemically amplified resists were prepared having the contents of the base resin and the acid generator, the addition rate of the filler and the kind of the solvent different from those of the above chemically amplified resist but in the specified range of the present invention. The evaluation of the chemically amplified resists revealed that all of the resins had the excellent controllability with respect to the dimensions and the shapes similarly to the above chemically amplified resist.

Since the above embodiments are described only for examples, the present invention is not limited to the above embodiments and various modifications or alterations can be easily made therefrom by those skilled in the art without departing from the scope of the present invention.

What is claimed is:

1. A chemically amplified resist comprising hydroxystyrene resin protected by an ethoxyethyl group and acting as base resin, the hydroxystyrene resin having a molecular weight between 5000 and 20000 and represented by a general formula [1]; a radiation-sensitive acid generator; polystyrene acting as a filler and having a molecular weight between 150 and 20000; and a solvent for dissolving the base resin, the acid generator and the filler, wherein a content of the hydroxystyrene resin is between 10 and 20% in weight with respect to the entire chemically amplified resist, contents of the acid generator and the filler are between 1 and 15% in weight and between 0.5 and 6.0% in weight, respectively, with respect to the base resin, and a balance is the solvent

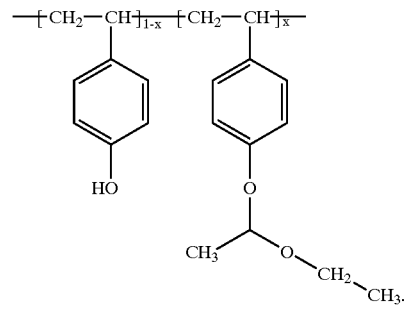

2. The chemically amplified resist as defined in claim 1, wherein the radiation-sensitive acid generator is a compound selected from the group consisting of triphenylsulfonium trifluoromethane sulfonic acid represented by a general formula [2], triphenylsulfonium methane sulfonic acid represented by a general formula [3], diphenyliodonium trifluoromethane sulfonic acid represented by a general formula [4], diphenyliodonium-methane sulfonic acid represented by a general formula [5], phthalimide trifluoromethane sulfonic acid represented by a general formula [6], phthalimide trimethane sulfonic acid represented by a general formula [7], naphthalimide trifluoromethane sulfonic acid represented by a general formula [8], naphthalimide trimethane sulfonic acid represented by a general formula [9], triphenylsulfonium toluenesulfonic acid represented by a general formula [10], triphenylsulfonium methylcyclohexylsulfonic acid represented by a general formula [11], diphenyliodonium toluenesulfonic acid represented by a general formula [12], diphenyliodonium methylcyclohexylsulfonic acid represented by a general formula [13], phthalimide toluenesulfonic acid represented by a general formula [14], phthalimide methycyclohexylsulfonic acid represented by a general formula [15], naphthalimidetoluenesulfonic acid represented by a general formula [16] and naphthalimide methylcyclohexylsulfonic acid represented by a general formula [17]

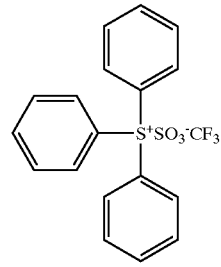

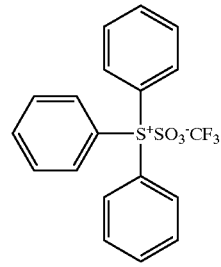

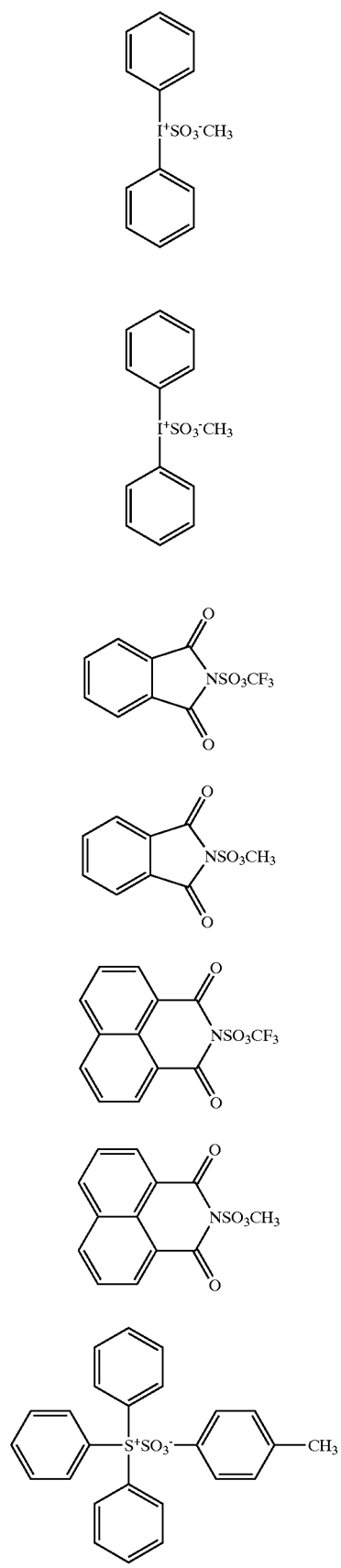
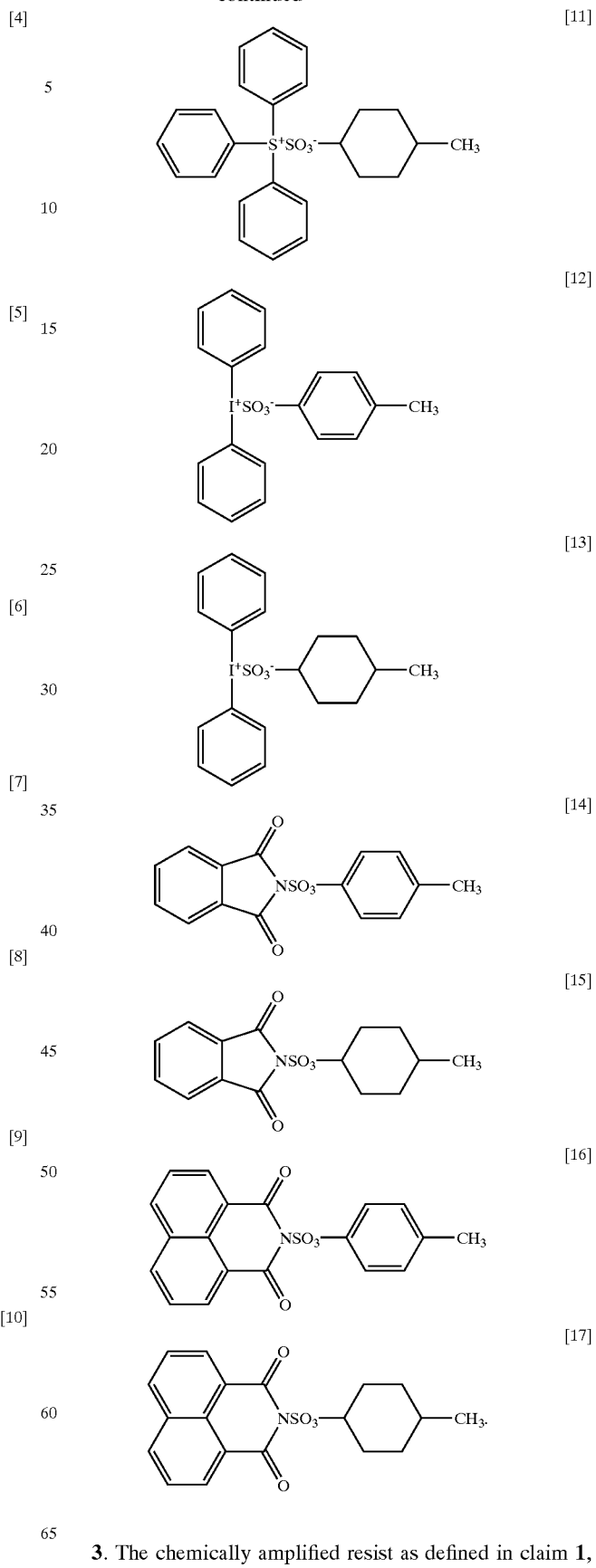
3. The chemically amplified resist as defined in claim 1, wherein the solvent is a compound selected from the group consisting of 2-haptanone represented by a general formula [18], PGMEA (propylene glycol monomethylether acetate) represented by a general formula [19], PGME (propylene glycolmonomethylether) represented by a general formula [20] and N-methylpyrrolidine represented by a general formula [21]

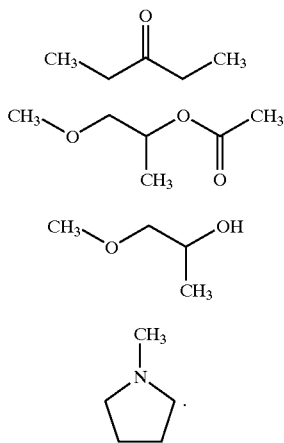

4. The chemically amplified resist as defined in claim 1, wherein the chemically amplified resist is thermally treated at a temperature between 90 and 110° C. before exposure to light.

5. A chemically amplified resist as defined in claim 1, wherein said polystyrene filler has the formula

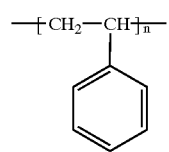

where n is an integer between 1.44 and 192.

6. A chemically amplified resist as defined in claim 5, wherein the polystyrene filler has a molecular weight of about 10000.

7. A method of patterning a substrate, comprising:

placing a layer of a chemically-amplified resist according to claim 1 on a substrate;

exposing said layer of resist to form a pattern of exposed and unexposed regions; and removing exposed regions of said layer of resist.

8. A method according to claim 7, wherein said layer of resist is exposed through a mask.

9. A method according to claim 7, wherein said layer of resist is exposed with a KrF excimer laser.

10. A method according to claim 7, wherein said pattern has a line width of 0.18 μm or less.

11. A method according to claim 10, wherein said pattern is a pattern of isolated lines having a thickness of 0.15 μm after development.

12. A method according to claim 7, wherein the thickness of the layer of resist is 0.5 μm.

* * * * *